(12) United States Patent
Jain et al.

(10) Patent No.: US 12,287,377 B2
(45) Date of Patent: Apr. 29, 2025

(54) CABLE FAULT DETECTION

(71) Applicant: TEXAS INSTRUMENTS INCORPORATED, Dallas, TX (US)

(72) Inventors: Arihant Jain, Milpitas, CA (US); Ashwin Ramachandran, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/692,467

(22) Filed: Mar. 11, 2022

(65) Prior Publication Data

US 2023/0288495 A1 Sep. 14, 2023

(51) Int. Cl.
*G01R 31/52* (2020.01)
*G01R 31/58* (2020.01)

(52) U.S. Cl.
CPC ............ *G01R 31/52* (2020.01); *G01R 31/58* (2020.01)

(58) Field of Classification Search
CPC .......................... G01R 31/50–55; G01R 31/58
See application file for complete search history.

(56) References Cited

U.S. PATENT DOCUMENTS

| | | | | |
|---|---|---|---|---|
| 4,109,234 A * | 8/1978 | Davis | ...................... | B60T 8/885 340/661 |
| 6,154,020 A * | 11/2000 | Moulton | ................ | G01R 31/58 324/523 |
| 9,791,482 B1 * | 10/2017 | Carpenter, Jr. | .......... | H02H 3/08 |
| 2006/0197508 A1 * | 9/2006 | Matsumoto | ............. | F02D 41/20 323/201 |
| 2011/0279108 A1 * | 11/2011 | Barnett | .................. | H05K 1/162 324/76.11 |
| 2014/0361783 A1 * | 12/2014 | Haas | ...................... | G01R 31/52 324/509 |
| 2016/0299187 A1 * | 10/2016 | Liang | ................... | H02H 1/0092 |
| 2017/0234918 A1 * | 8/2017 | Tsuchiya | .............. | G01R 31/006 324/503 |
| 2019/0146022 A1 * | 5/2019 | Kinsella | ................. | G01R 31/34 324/509 |
| 2019/0317132 A1 * | 10/2019 | Ju | .......................... | G01R 31/58 |

FOREIGN PATENT DOCUMENTS

DE 3742617 A1 * 9/1989
JP 2014232879 A * 12/2014

* cited by examiner

*Primary Examiner* — Lee E Rodak
*Assistant Examiner* — Demetrius R Pretlow
(74) *Attorney, Agent, or Firm* — Valerie M. Davis; Frank D. Cimino

(57) ABSTRACT

A method for detecting a fault with a cable having a resistor divider couple to the cable. The method includes converting a first sense voltage from the resistor divider network to a first digital code, determining whether the first digital code falls within a first range of digital codes corresponding to a first fault associated with the cable, and responsive to determining that the first digital code falls within the first range of digital codes, generating an indication of the first fault.

14 Claims, 8 Drawing Sheets

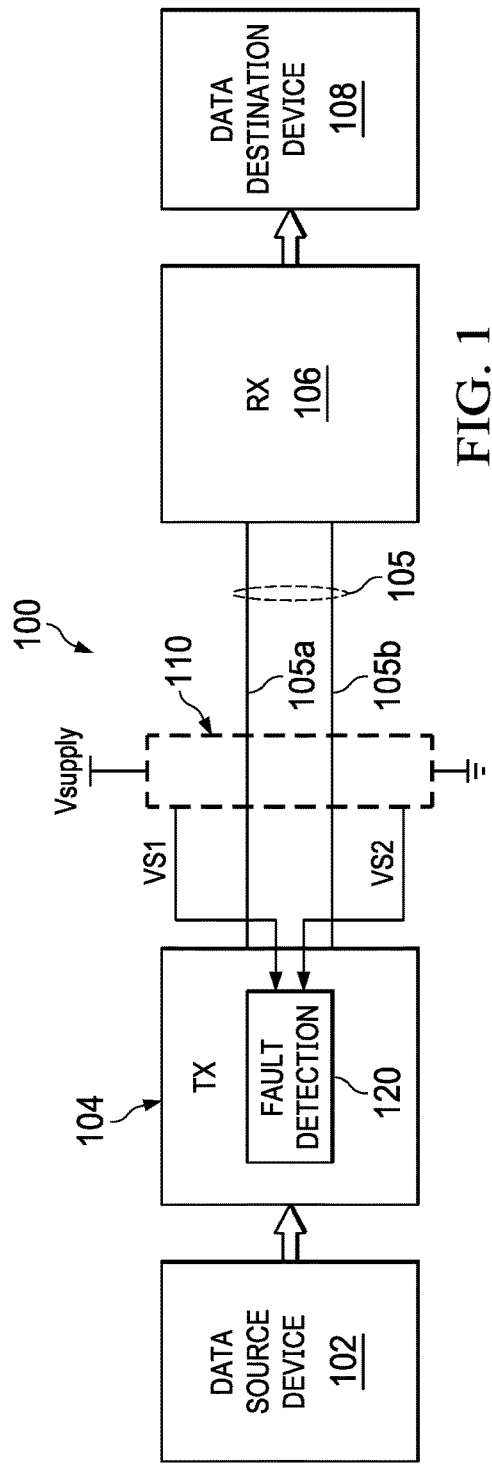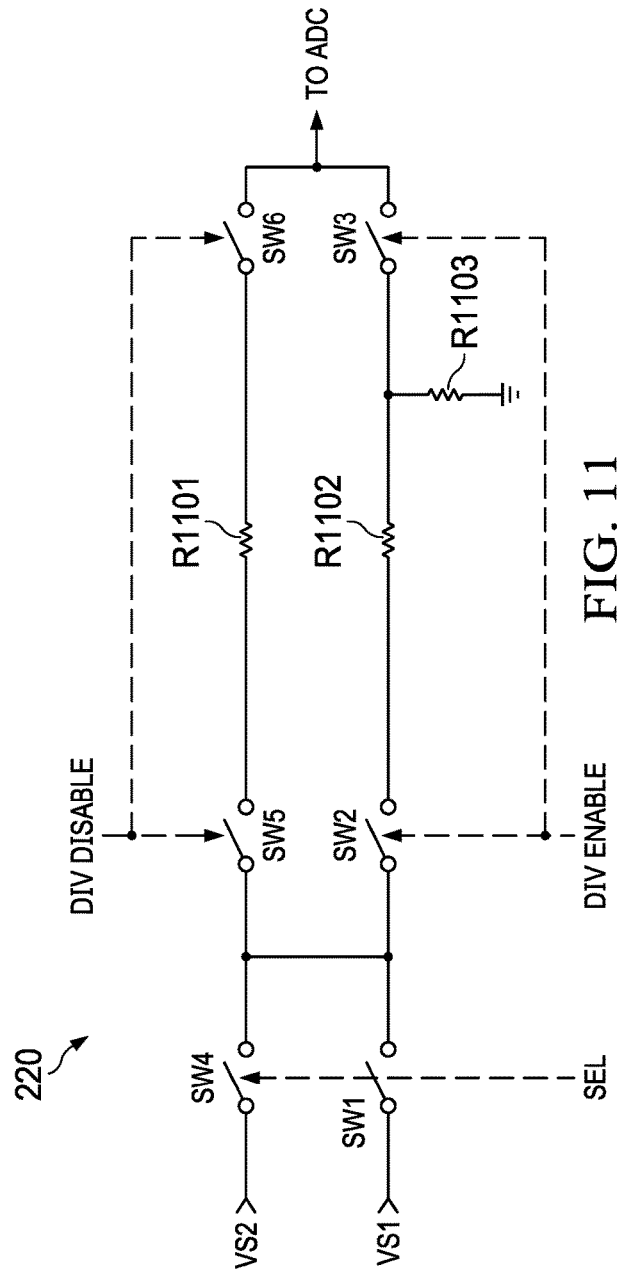
FIG. 1
FIG. 11

CABLE FAULT DETECTION

BACKGROUND

In many systems, a cable interconnects to device. Electrical signals (e.g., data, instructions, voltage and/or current supplies, etc.) from one device to the other are transmitted over the cable. For example, an automobile has cables that connect sources of graphics and video to displays (e.g., rear view camera systems, infotainment systems, etc.).

SUMMARY

In at least embodiment, a method is presented for detecting a fault with a cable having a resistor divider coupled to the cable. The method includes converting a first sense voltage from the resistor divider network to a first digital code, determining whether the first digital code falls within a first range of digital codes corresponding to a first fault associated with the cable, and responsive to determining that the first digital code falls within the first range of digital codes, generating an indication of the first fault.

In another embodiment, an integrated circuit (IC) includes a multiplexer having a first multiplexer input, a selection input, and a multiplexer output. The first multiplexer input is adapted to be coupled to a first resistor within a resistor divider network, and the resistor divider network is coupled to a conductor within a cable. The IC further includes an analog-to-digital converter (ADC) having an ADC analog input and an ADC digital output, the ADC analog input coupled to the multiplexer output. The IC also includes a digital control circuit having a selection output and a digital input. The digital control circuit is configured to: assert the selection output to cause the multiplexer to select the first multiplexer input to thereby cause the ADC to convert a voltage of the first resistor to a first digital code; determine whether the first digital code falls within a first range of digital codes corresponding to a first fault associated with the cable; and responsive to a determination that the first digital code falls within the first range of digital codes, generate an indication of the first fault.

BRIEF DESCRIPTION OF THE DRAWINGS

For a detailed description of various examples, reference will now be made to the accompanying drawings in which:

FIG. 1 is a schematic diagram of a system in which devices are interconnected with a cable and at least one device has a fault detection circuit configured to detect a fault with the cable using a resistor divider in accordance with an example.

FIG. 11 is a schematic implementation of a multiplexer usable in the embodiment of FIG. 2.

The same reference number or other reference designators are used in the drawings for the same or similar (either by function and/or structure) features.

DETAILED DESCRIPTION

Figure 2:
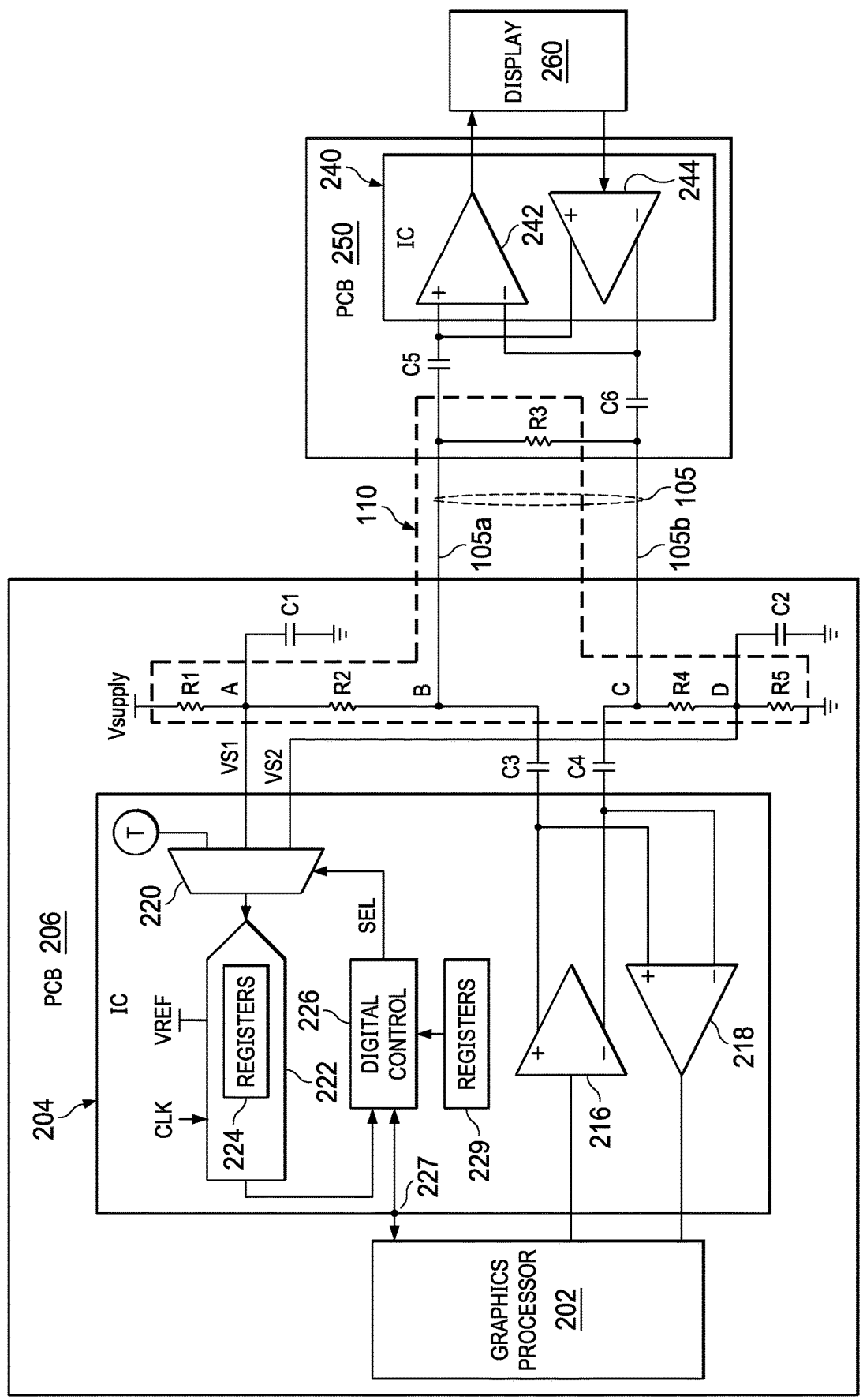
FIG. 2 is an example of a system in which the cable includes multiple conductors and a resistor divider is coupled across the conductors in accordance with an example.

For a cable having, for example, two conductors interconnecting two or more devices, various types of fault conditions may occur. Examples of such fault conditions include one conductor within the cable being shorted to another conductor, any of the cable conductors being shorted to a supply voltage or to ground, or any of the conductors being open (the cable being disconnected, a conductor becoming loose within the cable, etc.). In many applications, it would be useful to determine whether any of these cable fault conditions have occurred. Further, it may be useful to identify which of the cable fault conditions have occurred. For example, in the case of an automobile the driver of the automobile can be alerted that the rearview camera display is inoperative and a diagnostic code can be stored identifying the type of problem the display has experienced (cable disconnected, cable shorted to power supply, etc.). Some example embodiments described herein may address these issues.

FIG. 1 shows an example embodiment of a system 100 which includes a data source device 102, a transmitter (TX) 104, a cable 105, a receiver (RX) 106, and data destination device 108. The cable 105 interconnects the transmitter 104 and the receiver 106. In this example, the cable 105 includes two conductors 105a and 105b. In other examples, the cable 105 can include any suitable number of conductors (one or more). Further, while signals pass through the cable 105 from the transmitter 104 to the receiver 106 (and thus from the data source device 102 to the data destination device 108) in this example, in other examples, each device 102 and 108 is capable of both sending and receiving signals to/from the other device (bi-directional signaling). Further still, the cable 105 is shown interconnecting two devices 102 and 108, but in general can be coupled to any suitable number of devices.

A resistor divider network 110 (shown symbolically as a dashed box) is coupled between a supply voltage Vsupply and ground across the conductors 105a and 105b of the cable 105 (discussed in more details below). Each conductor 105a and 105b is coupled to at least one resistor within the resistor divider network. The resistor divider network 110 has two nodes which provide voltages labeled as VS1 and VS2. VS1 is a voltage on a terminal of at least one of the resistors in the resistor divider network 110, and VS2 is a voltage on another terminal of at least one other resistor in the resistor divider network.

Based on the magnitude of Vsupply and the configuration and relative resistances of the resistors of the resistor divider network 110, the VS1 and VS2 voltages are each nominally within a particular voltage range (unique to each of VS1 and VS2) absent a fault condition for the cable. However, any of the aforementioned cable fault conditions will change the voltage VS1 and/or VS2. A fault detection circuit 120 within, or otherwise coupled to, the transmitter 104 compares at least one of VS1 and VS2 to the corresponding nominal voltage range and to one or more voltage ranges corresponding to any one or more of the cable fault conditions. The fault detection circuit 120 determines whether a fault with the cable 105 has occurred and, if it has, identifies the type of fault.

FIG. 2 is a block diagram of a system 200 in accordance with an example. System 200 includes cable 105 interconnecting printed circuit boards (PCBs) 206 and 250. An integrated circuit (IC) 204, a graphics processor 202 (which also may be implemented as an IC), resistors R1, R2, R4, and R5, and capacitors C1-C4 are provided on (e.g., mounted to) PCB 206. An IC 240, resistor R3 and capacitors C4 and C5 are provided on PCB 250. Capacitors C3, C4, C5, and C6 implement AC-coupling (e.g., capacitors C3-C6 block direct current, DC, signals from passing between the ICs but allow alternating current, AC, signals or signals modulated on a carrier frequency signal to pass from one IC to the other) between the ICs. Other support and interconnect mechanisms besides a PCB can be used as well for providing the components shown in FIG. 2. As explained above, cable 105 includes conductors 105a and 105b, and may include additional conductors as desired. In the example of FIG. 2, conductors 105a and 105b within cable 105 are a shielded twisted pair (STP) of conductors over which differential signaling is implemented.

The IC 204 includes a transmitter 216, a receiver 218, a multiplexer 220, an analog-to-digital converter (ADC) 222, and a digital control circuit 226 (including, for example, digital circuitry, analog circuitry, memory, registers, a processor, a microcomputer and/or software). One or more registers 229 are coupled to, and accessible by, the digital control circuit 226. The registers 229 store the threshold values described herein. The transmitter 216 includes positive and negative outputs to provide differential signals to the conductors 105a and 105b of cable 105 via DC blocking capacitors C3 and C4, which implement AC-coupling between ICs 204 and 240. The receiver 218 includes positive and negative inputs coupled to conductors 105a and 105b, respectively. In this example, the graphics processor 202 generates graphics signals to be transmitted over cable 105 to IC 240 for presentation on display 260. Accordingly, IC 240 also includes a receiver 242 and a transmitter 244. Capacitors C5 and C6 are DC-blocking capacitors on PCB 250 for AC-coupling purposes. Transmitter 216 within IC 204 and receiver 242 within IC 240 facilitates the transfer of graphics signals from the graphics processor 202 to the display 260. Bi-directional signaling also is implemented in this example, and the combination of transmitter 244 in IC 240 and the receiver 218 in IC 204 facilitates the flow of signals from display 260 back to the graphics processor 202.

In the example of FIG. 2, the resistor divider network 110 of FIG. 1 includes resistors R1-R5. R3 is provided on PCB 250, while R1, R2, R4, and R5 are provided on PCB 206. All five resistors R1-R5 are coupled in series between the supply voltage node, Vsupply, and ground. R1 is coupled to Vsupply, and R5 is coupled to ground. The connection node A between R1 and R2 provides the sense voltage VS1, and the connection node D between R4 and R5 provides the sense voltage VS2. Although R3 is on an opposite end of cable 105 as resistors R2 and R5, R3 is coupled between R2 (at node B) and R4 (at node C).

VS1 (node A) is coupled to one input of multiplexer 220, and VS2 (node D) is coupled to another input of multiplexer 220. The multiplexer 220 may have additional inputs. One such input is shown coupled to a temperature sensor T. The multiplexer 220 is used to detect cable faults as described herein but can be used for other (non-cable fault) reasons as well (e.g., converting a temperature signal to a digital value). The selected output signal from multiplexer 220 is coupled to an input of the ADC 222. The ADC converts the multiplexer's output signal to a digital code and stores the digital code in a register 224. The ADC 222 receives a reference voltage (VREF) for its operation, as well a clock (CLK). The ADC 222 converts an input voltage between ground and VREF into a digital code. In one example, the ADC 222 outputs an 8-bit digital code. Accordingly, the ADC 222 in this example outputs digital codes between 0 and 255 (decimal). Any input voltage to the ADC 222 at or above VREF saturates the ADC and the output code from the ADC is its maximum value (e.g., 255 for an 8-bit ADC). VREF may be smaller than the supply voltage (Vsupply) used by the ADC 222. In one example, VREF is 1.1V and Vsupply is 1.8V.

The digital control circuit 226 provides a select (SEL) signal to the multiplexer 220 to cause the multiplexer to select the corresponding input for digitization by the ADC 222. The digital control circuit 226 also can read the register(s) in which the resulting digital codes are stored for VS1 and VS2. As explained below, based on the digital code equivalents of VS1 and/or VS2, the digital control circuit 226 can determine whether the cable 105 is in a normal operating state (no fault condition), whether the cable is experiencing a fault, and, if a fault is present, the type of fault.

In some implementations, the grounds on the PCBs 206 and 250 (and thus of the ICs 204 and 240) may be different (e.g., by a few hundred millivolts). The system integrator (that designs and tests the system comprising the PCBs and their constituent components) can measure the amount of offset between the PCBs' grounds and store the offset value (its digital equivalent) in register 229. The offset value is used by the digital control circuit 226 to correct the digital codes produced by ADC 222. The offset value may be a positive or a negative value. The digital control circuit 226 may, for example, add the offset value from register 229 to the digital codes produced by the ADC 222. In one embodiment, the offset-corrected digital codes are the digital codes used to detect cable fault conditions.

In the example of FIG. 2, the fault conditions that are detectable include:
  conductor 105a being shorted to ground or to a supply voltage (e.g., Vsupply);
  similarly, conductor 105b being shorted to ground or to a supply voltage (e.g., Vsupply);
  conductors 105a and 105b shorted to each other; and
  the cable 105 being "open", such as at least one of the conductors 105a and 105b is not connected to anything (e.g., the cable is disconnected or a conductor connection has become loose and disconnected).

Capacitor C2 in combination with the resistor divider resistors forms a low-pass filter In the example of FIG. 2, the low-pass filter transfer function for VS2 is:

$$VS2/Vin = \frac{(R2+Z1)\|(R3+R4+Z5)}{Rs+(R2+Z1)\|(R3+R4+R5)} * \frac{Z5}{R3+R4+Z5} \quad (1)$$

where Vin represents the high-speed differential data signal from transmitter 216, Z1 is the parallel combination of R1 and C1, Z5 is the parallel combination of R5 and C2, and R5 is the impedance presented by the cable 105 to PCB 206. Similarly, the transfer function for the low-pass filter for VS1 is:

$$VS1/Vin = \frac{(R2+Z1)\|(R3+R4+Z5)}{Rs+(R2+Z1)\|(R3+R4+Z5)} * \frac{Z1}{R2+Z1} \quad (2)$$

The use of the resistor divider in the examples described herein is based on the direct current (DC) voltages on the resistor divider network. Thus, the low-pass filters attenuate higher frequency content on VS1 and VS2 so that the DC levels of VS1 and VS2 re analyzed for purposes of detecting cable faults.

Figure 3:
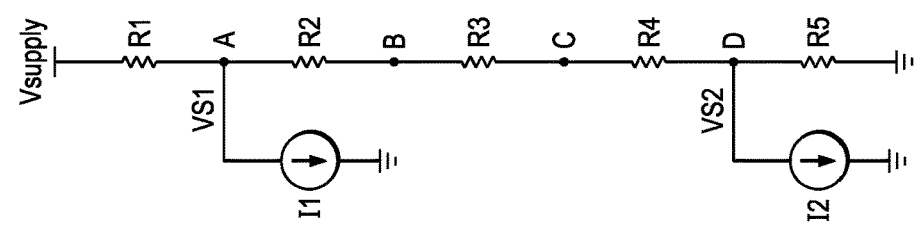
FIG. 3 is a schematic representation of the resistor divider of FIG. 2 for the normal operating condition in accordance with an example.

FIGS. 3-7 are circuit representations of the voltage divider network for the normal operating condition and the various fault conditions. FIG. 3 is an example of the normal operating condition. Resistors R1-R5 are connected in series between Vsupply and ground. The currents I1 and I2 model leakage current that may be present between the respective nodes A and D and ground through, for example, electrostatic discharge (ESD) diodes (not shown). With no cable faults, the magnitudes of VS1 and VS2 are a function of Vsupply, I1, I2, and the resistances of R1-R5. Specifically, VS1 is:

$$VS1 = \frac{(Vsupply + \Delta Vsupply)(R1+R3+R4+R5) + (I1*R1)(R2+R3+R4+R5) + (I2*R1*R5)}{K1} \quad (3)$$

where $\Delta V$ supply is the variance in the supply voltage and K1 is the sum of the resistances of R1 through R5). Similarly, VS2 is:

$$VS2 = \frac{(Vsupply + \Delta Vsupply)(R5) + (I2*R5)(R1+R2+R3+R4) + (I1*R1*R5)}{K1} \quad (4)$$

For the normal operating condition (no cable faults), a range for VS1 can be calculated based on $\Delta V$supply and the tolerance of the resistors. For example, assuming a $\Delta V$supply of +/−5%, a resistor tolerance of +/−1%, and negligible leakage currents I1 and I2, the maximum VS1 value (VS1+) and the minimum VS1 value (VS1−) can be calculated as:

$$VS1+ = \frac{(Vsupply*1.05)(R2+R3+R4+R5)*1.01}{(R1*0.99)+(R2+R3+R4+R5)*1.01} \quad (5)$$

$$VS1- = \frac{(Vsupply*0.95)(R2+R3+R4+R5)*0.99}{(R1*1.01)+(R2+R3+R4+R5)*0.99} \quad (6)$$

Equations (5) and (6) above do not require the resistances of R1-R5 to be the same. In one embodiment for the STP cable example of FIG. 2, the resistance of each of R2, R3, R4, and R5 is 10 kΩ, and the resistance of R1 is 25 kΩ. In this embodiment, each of resistors R1-R5 may have a tolerance of +/−1%.

In one example, the ADC 222 outputs an 8-bit digital code. Accordingly, the range of the decimal digital code is from 0 to 255. The decimal digital code value for a given analog VS1 voltage is:

Decimal Digital Code=VS1*255/VREF  (7)

For a particular value of VREF, the range of the digital codes for VS1 for a cable 105 in the normal operating condition (no faults) can be calculated based using equations (5), (6), and (7). In one example in which R2, R3, R4, and R5 are 10 kΩ, 1% resistors, R1 is a 25 kΩ 1% resistor, VREF is 1.207 V, and Vsupply is 1.8V, the analog voltages for the minimum and maximum values of VS1 are 1.065V and 1.173V, which corresponds to decimal codes 225 and 248, respectively.

Figure 4:
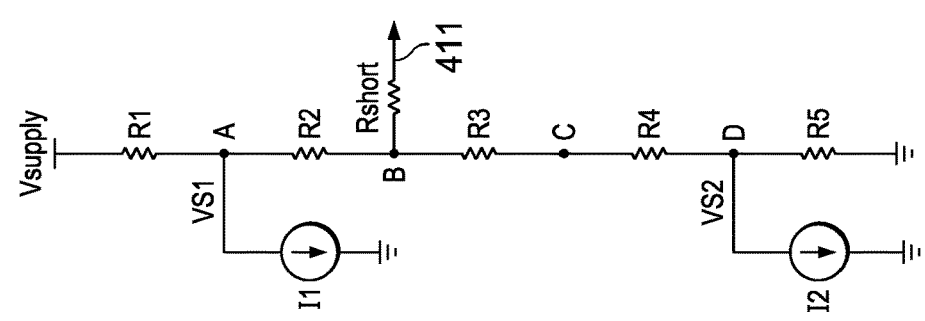

FIG. 4 is an example circuit representation for a fault condition in which node B (conductor 105a) is shorted either to ground or to a higher voltage (e.g., a supply voltage) at node 411. Resistor Rshort represents a resistance between nodes B and 411 (e.g., conductor resistance of the short circuit path). In this fault condition, the equation for VS1 is:

VS1=VS1_supply+VS1_short+VS1_I1+VS1_I2  (8)

where ('$\|$' is the operator for resistances in parallel):

$$VS1\_supply = \frac{(Vsupply + \Delta Vsupply)(R2+Rshort)\|(R3+R4+R5)}{R1+R2+Rshort\|(R3+R4+R5)} \quad (9)$$

$$VS1\_short = \frac{(Vshort + \Delta Vshort)(R3+R4+R5)}{Rshort+[(R3+R4+R5)\|(R1+R2)]} \cdot \frac{}{(R1+R2+R3+R4+R5)} \quad (10)$$

$$VS1\_I1 = (I1)(R1\|\{R2+[Rshort\|(R3+R4+R5)]\}) \quad (11)$$

$$VS1\_I2 = \frac{(R1)(I2)(R5)(Rshort)}{R5+R4+R3+[Rshort\|(R1+R2)]} \cdot \frac{}{(R1+R2+Rshort)} \quad (12)$$

Similarly, VS2 can be calculated as:

VS2=VS2_supply+VS2_short+VS2_I1+VS2_I2  (13)

where:

$$VS2\_supply = \frac{(Vsupply + \Delta Vsupply)(Rshort)(R5)}{R1+R2+[Rshort\|(R3+R4+R5)]} \cdot \frac{}{(R3+R4+R5+Rshort)} \quad (14)$$

$$VS2\_short = \frac{(Vshort + \Delta Vshort)(R1+R2)(R5)}{\{Rshort+[(R3+R4+R5)\|(R1+R2)]\}} \cdot \frac{}{(R1+R2+R3+R4+R5)} \quad (15)$$

$$VS2\_I1 = \frac{(R1)(I1)(R5)(Rshort)}{R1+R2+[Rshort\|(R3+R4+R5)]} \cdot \frac{}{(R1+R2+R3+R4+R5)} \quad (16)$$

$$VS2\_I2 = (I2)\{R5\|[R4+R3+[Rshort\|(R1+R2)]]\} \quad (17)$$

For a short to a supply voltage, Vshort can be substituted by the supply voltage used, and for a short to ground, Vshort will be 0. Similar to above, by accounting for supply voltage and resistor component variation, a minimum and maximum VS1 value can be determined and, in turn, threshold values for the VS1 and VS2 digital codes can be derived for the fault condition in which node 411 is a ground and when node 411 is a higher voltage (e.g., a supply voltage).

Figure 5:
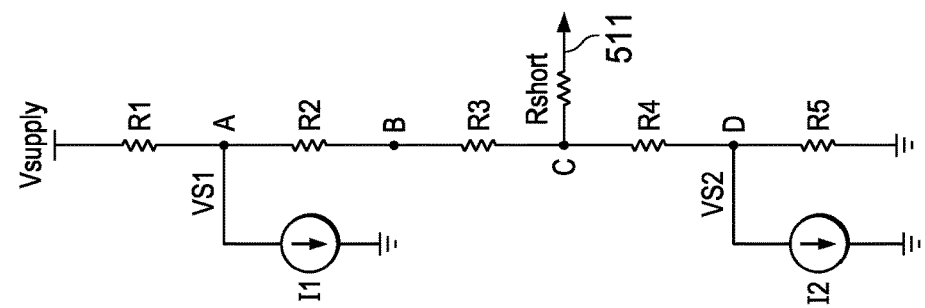

FIG. 5 is an example circuit representation for a fault condition in which node C (conductor 105b) is shorted either to ground or to a higher voltage (e.g., a supply voltage) at node 511. Resistor Rshort represents a resistance between nodes C and 511. In this fault condition, the equation for VS1 is:

$$VS1 = VS1\_supplya + VS1\_shorta + VS1\_I1a + VS1\_I2a \quad (18)$$

where:

$$VS1\_supplya = \frac{(Vsupply + \Delta Vsupply)(R2+R3+Rshort\|}{(R4+R5)R1 + R2 + R3 + Rshort\|(R4 + R5)} \quad (19)$$

$$VS1\_shorta = \frac{(Vshort + \Delta Vshort)(R4 + R5)(R1)}{[Rshort + (R4 + R5)\|(R1 + R2+R3)]} \quad (20)$$
$$(R1+R2+R3+Rshort)$$

$$VS1\_I1a = (I1)(R1\|\{R2 + R3 + [Rshort\|(R4 + R5)]\}) \quad (21)$$

$$VS1\_I2a = \frac{(R1)(I2)(R5)(Rshort)}{(R5 + R4 + [Rshort\|(R1 + R2 + R3)])} \quad (22)$$
$$(R1 + R2 + R3 + Rshort)$$

Similarly, VS2 can be calculated as:

$$VS2 = VS2\_supplya + VS2\_shorta + VS2\_I1a + VS2\_I2a \quad (23)$$

where:

$$VS2\_supplya = \frac{(Vsupply + \Delta Vsupply)(Rshort)(R5)}{R1 + R2 + R3 + [Rshort\|(R4 + R5)]} \quad (24)$$
$$(R4 + R5 + Rshort)$$

$$VS2\_shorta = \frac{(Vshort + \Delta Vshort)(R1 + R2+R3)(R5)}{\{Rshort + [(R4 + R5)\|(R1 + R2+R3)]\}} \quad (25)$$
$$(R1 + R2 + R3 + R4 + R5)$$

$$VS2\_I1a = \frac{(R1)(I1)(R5)(Rshort)}{R1 + R2 + [Rshort\|(R3 + R4 + R5)]} \quad (26)$$
$$(R1 + R2 + R3 + R4 + R5)$$

$$VS2\_I2a = (I2)(R5\|\{R4 + [Rshort\|(R1 + R2+R3)]\}) \quad (27)$$

For a short to a supply voltage, Vshort can be substituted by the supply voltage used, and for a short to ground, Vshort will be 0. Similar to above, by accounting for supply voltage and resistor component variation, a minimum and maximum VS1 value can be determined and, in turn, threshold values for the VS1 and VS2 digital codes can be derived for the fault condition in which node 511 is a ground and when node 511 is a higher voltage (e.g., a supply voltage).

Figure 6:
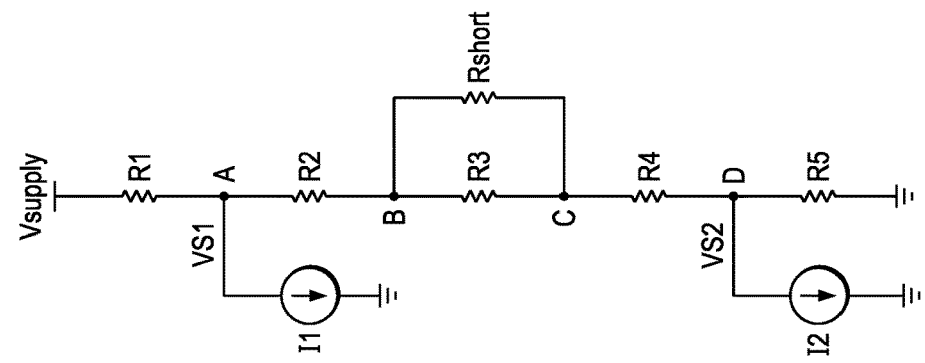

FIG. 6 models the circuit in which the conductors 105a (node B) and 105b (node C) of cable 105 are shorted to each other (the short modeled as a resistance Rshort). In this fault condition, VS1 and VS2 are:

$$VS1 = \frac{\begin{array}{c}(Vsupply + \Delta Vsupply)(R2+Rshort\|R3 + R4 + R5) + \\ (I1*R1)(R2 + Rshort\|R3 + R4 + R5) + (I2*R1*R5)\end{array}}{K2} \quad (28)$$

$$VS2 = \frac{\begin{array}{c}(Vsupply + \Delta Vsupply)(R5)+(I2*R5)\\(R1 + R2 + Rshort\|R3 + R4) + (I1*R1*R5)\end{array}}{K2} \quad (29)$$

where, K2=R1+R2+(Rshort∥R3)+R4+R5. The decimal code threshold for the cable fault condition in which the conductors of the cable are shorted to each other can be derived by solving for the minimum and maximum sensed voltages as explained above.

Figure 7:
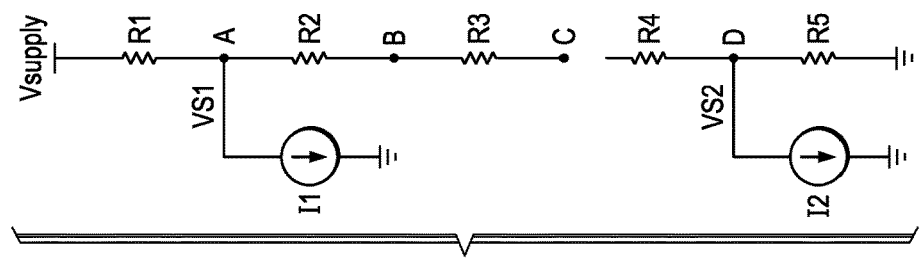
FIGS. 4-7 are schematic representations of the resistor divider of FIG. 2 for various cable fault conditions in accordance with an example.

FIG. 7 illustrates the cable open condition in which at least one of the cable's conductors are not connected. For this fault condition, VS1=Vsupply+ΔVsupply+(I1)(R1) and VS2=(I2)(R5).

Figure 8:
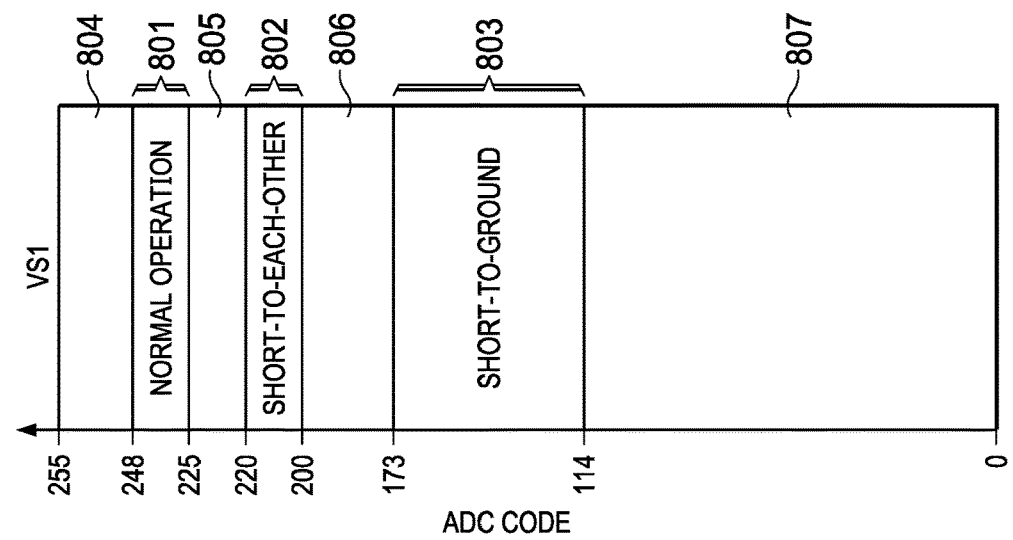
FIG. 8 is a graph of digital codes for a first sense voltage of the resistor divider of FIG. 2 in accordance with an example.

FIG. 8 is a table of example digital codes for VS1 for the normal operating condition and two of the cable fault conditions. Digital code range 801 includes digital codes for VS1 for the normal operating condition (no cable faults). The digital codes range from 225 to 248 in this example due to the tolerances of the resistors (e.g., 1%) and the variation of Vsupply (e.g., 5%). Digital code range 802 includes digital codes (ranging from 200 to 220) for the cable fault condition in which the conductors 105a and 105b of the cable 105 are shorted to each other. Digital code range 803 includes digital codes for the cable fault condition in which one of the cable conductors 105a and 105b is shorted to ground. The range of digital codes for the "short-to-ground" fault condition have a fairly large range (114 to 173) due to the fact that either conductor 105a or 105b may be shorted to ground as well as tolerance levels of the resistors and supply voltage variations.

VS1 can be used to determine whether the cable has no faults (digital codes in range 801), whether the cable has experienced a short between the conductors of the cable (range 802), or whether one of the conductors of the cable has shorted to ground (range 803). In this example, VS1 is not usable to detect the open condition (FIG. 7) or whether one of the cables has shorted to supply voltage because for any of these conditions, the ADC 222 will likely be saturated.

In one embodiment, responsive to the digital control circuit 226 reading a digital code from the ADC 222 that is at the maximum permitted value (e.g., 255 for an 8-bit ADC), the digital control circuit 226 causes the analog voltage level for VS1 to be scaled down by a factor of, for example, 2. As explained below, upon VS1 being scaled down by a factor of 2, a different set of digital code ranges are used against which VS1 is compared to determine the existence of a cable fault condition.

FIG. 11 is a schematic illustrating one possible implementation of multiplexer 220 having the ability to scale VS1 by a factor of 2. The multiplexer 220 of FIG. 11 includes switches SW1, SW2, SW3, SW4, SW5 and SW6. Each switch may be implemented by one or more transistors. The select signal SEL from the digital control circuit 226 is coupled to and controls the open/closed (non-conducting/conducting) status of switches SW1 and SW4. VS1 is coupled to one terminal of SW1, and the opposing terminal of SW1 is coupled to terminals of SW2 and SW5. VS2 is coupled to one terminal of SW4, and the opposing terminal of SW4 also is coupled to SW2 and SW5. Accordingly, if SEL is a first logic state, SW1 closes (SW4 is open) and VS1 is coupled to SW2 and SW5. If SEL is in a second, opposite logic state, SW4 is closed (and SW1 is open), and VS2 is coupled to SW2 and SW5.

Although not shown in the example of FIG. 2, the digital control circuit 226 generates one or more additional control signals for the multiplexer 220. One control signal is DIV ENABLE and the other control signal is DIV DISABLE. DIV DISABLE controls the open/closed status of SW5 and SW6, and DIV ENABLE controls the open/closed status of SW2 and SW3. DIV ENABLE is at the opposite logic polarity as DIV DISABLE. Accordingly, either SW5 and SW6 are closed (and SW2 and SW3 are open) to disable the scale down function of the multiplexer or, conversely SW2 and SW3 are closed (and SW5 and SW6 are open) to enable the scale down function of the multiplexer.

The digital control circuit 226 disables the scale down function of the multiplexer 220 when configuring the multiplexer to pass VS2 through the multiplexer to the ADC 222. The digital control circuit 226 can selectively configure the multiplexer to scale down VS1 or not to scale down VS1 depending on whether the ADC has saturated. If the ADC 222 saturates upon converting VS1, then the digital control circuit 226 asserts DIV ENABLE to close SW2 and SW3 (and controls DIV DISABLE to open SW5 and SW6). Resistors R1102 and R1103 form a voltage divider to divide down VS1 as it is coupled from SW1 through SW2 and to SW3. In one example, the resistance values of R1102 and R1103 are the same and thus the output from the multiplexer is a voltage that is one-half of the voltage of VS1. If the ADC has not saturated, the digital control circuit 226 asserts DIV DISABLE to close SW5 and SW6 when converting VS1 to a digital code, and thus the multiplexer does not scale down VS1.

Figure 12:
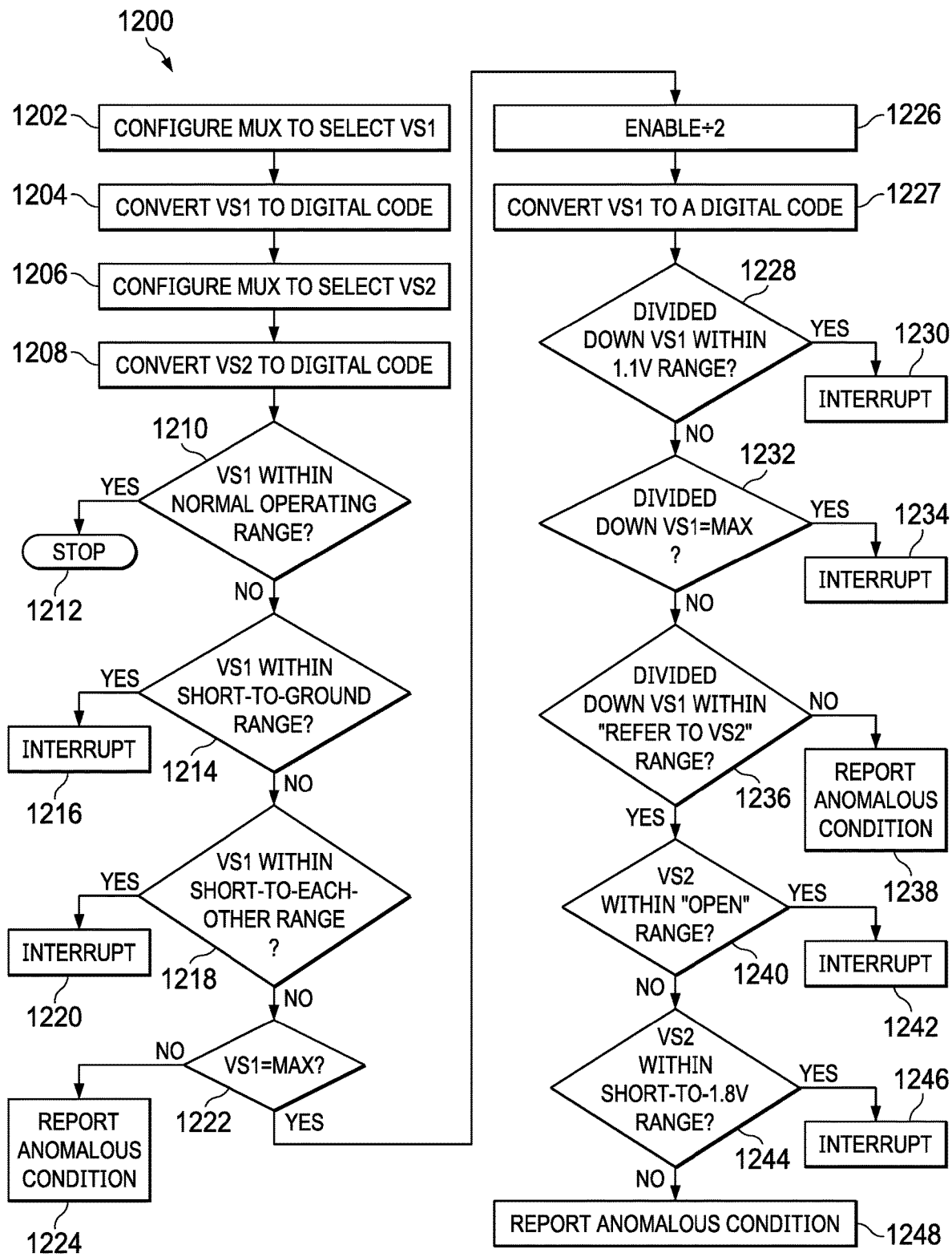
FIG. 12 is a flow chart illustrating a method for detecting a cable fault in accordance with an example.

FIG. 12 is a flowchart illustrating a method 1200 for determining whether STP cable 105 of FIG. 2 has a fault condition and, if so, the type of fault condition. The order of the steps can be performed in the order shown or in a different order. Method 1200 is initiated, and largely performed, by the digital control circuit 226 to detect the presence of a cable fault condition. In one example, the digital control circuit 226 periodically initiates method 1200 (e.g., every 200 milliseconds). The frequency with which method 1200 is performed is fast enough to sufficiently quickly (for the given application) detect a cable fault condition should one occur.

At step 1202, the digital control circuit 226 configures the multiplexer 220 to select VS1 to be converted to a digital code by the ADC 222. In the example of FIG. 11, the digital control circuit 226 asserts SEL to close SW1, asserts DIV DISABLE to close SW5 and SW6, and controls DIV ENABLE to open SW2 and SW3. VS1 is thus provided to the ADC 222 through R1101 and, at step 1204, VS1 is converted to a digital code by the ADC and stored in a register 224.

At step 1206, the digital control circuit 226 then configures the multiplexer 220 to select VS2 to be converted to a digital code by the ADC 222. In the example of FIG. 11, the digital control circuit asserts SEL to close SW4, asserts DIV DISABLE to close SW5 and SW6, and controls DIV ENABLE to open SW2 and SW3. VS2 is thus provided to the ADC 222 through R1101 and, at step 1208, VS2 is converted to a digital code by the ADC and stored in a register 224. In some embodiments, steps 1202, 1204, 1206, and 1208 are repeated multiple times (e.g., 5 times, 10 times, etc.) with the digital codes for VS1 averaged together and the digital codes for VS2 averaged together, and the averaged VS1 and VS2 values are used to detect cable fault conditions.

The digital control circuit 226 can read the registers 224 to read the digital code equivalents of VS1 and VS2. The rest of method 1200 uses the values of the digital codes to determine whether no cable fault condition exists, or whether a cable fault condition exists, and if so, which cable fault condition is present. The references in steps 1210 through 1248 to 'VS1' and 'VS2' refer to the digital code equivalents of those voltages (e.g., their averages as noted above) as produced by the ADC 222.

At step 1210, the digital control circuit 226 determines whether VS1 is within the normal operating range. This step can be performed by comparing VS1 to the upper and lower threshold values within the range corresponding to the normal operating range. In the example of FIG. 8, the upper and lower thresholds for the normal operating range are 248 and 225 (range 801), respectively. If VS1 is between those thresholds, then the cable 105 is determined to be free of any cable faults and the method stops at 1212. If VS1 is not within the normal operating range, then a fault condition exists and the method continues at step 1214 to determine the type of fault.

At step 1214, the digital control circuit 226 compares VS1 to the range of digital codes corresponding to a cable fault in which one of the conductors of the cable is shorted to ground (the example schematics of FIGS. 4 and 5 where the short is to ground). In the example of FIG. 8, VS1 is compared to the upper and lower thresholds corresponding to range 803 (173 and 114, respectively). If VS1 is between the upper and lower thresholds, then the cable is determined to have a short to ground and control passes to step 1216 in which the digital control circuit 226 generates an interrupt on output pin 227 (FIG. 2) of the IC 205. In the example of FIG. 2, the interrupt is provided on pin 227 to the graphics processor 202. In other examples, the digital control circuit 226 stores a fault flag indicative of a short-to-ground cable fault, and the graphics processor 202 (or other logic external to IC 204) can poll the fault flags to ascertain the presence of a cable fault.

The graphics processor 202 (or other external logic) can respond to the detection of any of the cable faults in any suitable manner. For example, the graphics processor 202 can cause an error message to be stored in its memory or to be displayed on display 260 to indicate the presence of a fault condition. In another example, IC 204 asserts an interrupt signal to the graphics processor 202, which may respond to the assertion of the interrupt signal by, for example, enabling a redundant signal path between the graphics processor 202 and the display 260

If VS1 is not within the short-to-ground range, then the method continues at step 1218. At step 1218, the digital control circuit 226 compares VS1 to the range of digital codes corresponding to a cable fault in which the conductors 105a and 105b of the cable 105 are shorted to each other (the example schematic of FIG. 6). In the example of FIG. 8, VS1 is compared to the upper and lower thresholds corresponding to range 802 (220 and 200, respectively). If VS1 is between those upper and lower thresholds, then the cable is determined to have a short between its conductors and control passes to step 1220 in which the digital control circuit 226 generates an interrupt on output pin 227 of the IC 204. As explained above, the interrupt is provided on pin 227 to the graphics processor 202. In other examples, the digital control circuit 226 stores a fault flag indicative of a short-to-ground cable fault, and the graphics processor 202 (or other logic external to IC 204) can poll the fault flags to ascertain the presence of a cable fault.

If VS1 is not within the short-to-each other range, then the method continues at step 1222. At step 1222, the digital control circuit 226 compares VS1 to the ADC's maximum value. For an 8-bit ADC, the maximum value is 255. If VS1 is not at 255, then the VS1 does not fall within ranges 801, 802, or 803, nor is VS1 at 255. Instead, VS1 is within one of the other undefined regions 804, 805, 806, or 807 of FIG. 8. In this case, control passes to step 1224 and the digital control circuit 226 reports an anomalous condition at pin 227 (e.g., an interrupt is provided, a status flag is set that is to be polled by external logic, etc.). The anomalous condition may indicate a problem with the cable, but the problem is not any of the defined cable faults the digital control circuit 226 is configured to detect.

If, however, VS1 is equal to the maximum value, the control continues at step 1226. That VS1 is equal to the maximum value can be caused by any of multiple reasons including (1) one of the cable conductors has been shorted to the supply voltage (FIGS. 4 and 5 where the short is to a supply voltage) or (2) the cable has an open-fault condition (FIG. 7). In one embodiment, Vsupply (supply voltage on PCB 206 and a supply voltage for IC 204) is a higher voltage than VREF (reference voltage for ADC 222). In one example, Vsupply is 1.8V and VREF is 1.1V. Thus, it is possible that a conductor within the cable 105 shorts to either 1.1V or to 1.8V. Method 1200 can differentiate between these two fault conditions.

At step 1226, the method includes enabling the scaling functionality of the multiplexer 220 as described above. In the example of FIG. 11, the digital control circuit 226 asserts SEL to close switch SW1 and controls DIV ENABLE to a logic state to cause switches SW2 and SW3 within the multiplexer 220 to close and controls DIV DISABLE to cause switches SW5 and SW6 to open. With the multiplexer 220 configured to scale down VS1 by a factor of 2, at step 1227 the method includes converting the scaled-down VS1 to a digital code, which can then be read from the registers 224 by the digital control circuit. As explained above, multiple samples and conversion of scaled-down VS1 can be averaged together in step 1227 to produce an averaged digital equivalent of the scaled down version of VS1.

Figure 10:
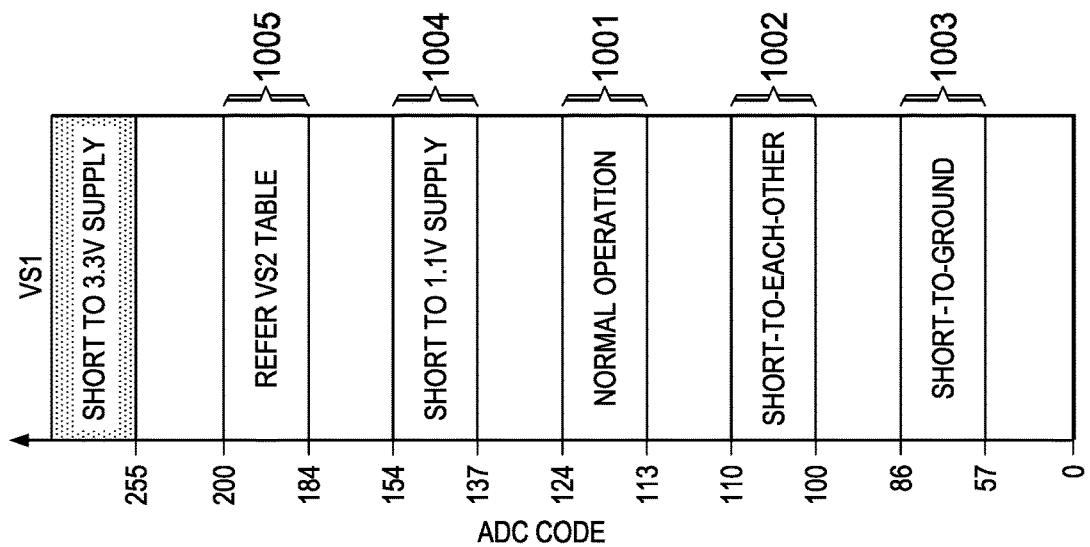
FIG. 10 is a graph of digital codes for the first sense voltage upon the first sense voltage being scaled down by a factor of two in accordance with an example.

With VS1 now being scaled down by a factor of 2, a different set of digital code ranges is used for comparison to VS1. FIG. 10 shows an illustrative table of digital codes that apply to VS1 when VS1 has been scaled down by a factor of 2. Ranges 1001, 1002, and 1003 are provided for the normal operation, short-to-each other, and short-ground ranges and have upper and lower limits of each range that are one-half the corresponding thresholds of the table of FIG. 8. The table in FIG. 10 also has a range 1004 for VS1 for a fault condition in which one of the cable's conductors is shorted to 1.1V. In this example, the upper and lower digital code thresholds for range 1004 are 154 and 137, respectively. Range 1005 includes digital codes ranging from 184 to 200. This digital code range pertains to either the open cable fault or the fault in which a cable conductor is shorted to higher voltage (e.g., Vsupply which may be 1.8V). For this latter fault in which the scaled down version of VS1 lies within range 1005, the digital control circuit 226 uses VS2 to identify the fault (open or short-to-1.8V).

Referring again to FIG. 12, at step 1228, the scaled-down VS1 is compared to the digital code range 1004 indicative of VREF (e.g., 1.1V). If the scaled-down VS1 is within range 1004, an interrupt (or another suitable fault indicator) is generated at step 1230. Otherwise, at step 1232, the digital control circuit 226 determines whether the scaled-down VS1 is at the maximum value of the ADC converter 222 (e.g., 255). If VS1 is at the maximum value, then at step 1234 the digital control circuit generates an interrupt (or another suitable fault indicator).

Figure 9:
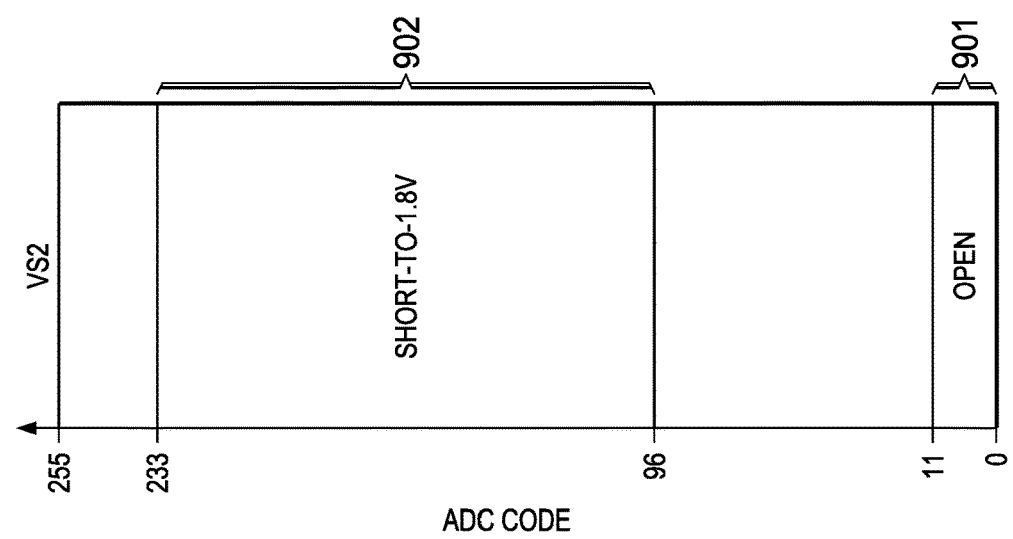
FIG. 9 is a graph of digital codes for a second sense voltage of the resistor divider of FIG. 2 in accordance with an example.

If the scaled-down VS1 is not at the maximum value, then at step 1236, the digital control circuit 226 determines whether VS1 is within range 1005. If VS1 is not within range 1005, then VS1 is determined to be in one of the undefined regions of the table in FIG. 10 and this condition is reported at step 1238. Otherwise, the digital control circuit 226 proceeds to analyze VS2 relative to the table of FIG. 9.

The digital equivalent of VS2 is the ADC's output from step 1208 and is not scaled down by a factor of 2. The illustrative table of FIG. 9 includes two ranges 901 and 902 corresponding to fault conditions detectable using VS2. Range 901 is the open fault condition in which at least one conductor of cable 105 is disconnected. When this fault occurs, the voltage on node D (VS2) in FIG. 2 is pulled low towards ground, and the digital code for VS2 will likely be in the range of 0 to 11. Range 902 corresponds to the fault condition in which at least one of the cable conductors is shorted to Vsupply (e.g., 1.8V). The digital codes in range 902 in this example span from 96 to 233.

At step 1240, the digital control circuit 226 determines whether VS2 is within the open fault range 901. If it is, then the digital control circuit 226 generates an interrupt (or equivalent fault indicator) at step 1242. Otherwise, the digital control circuit compares VS2 to the short-to-1.8V range 902 at step 1244. If VS2 is within range 902, then the digital control circuit 226 generates an interrupt (or equivalent fault indicator) at step 1246. If VS2 is not in ranges 901 or 902, then VS2 is within one of the undefined regions of the table of FIG. 9, and an anomalous fault condition is reported at step 1248.

In one embodiment, the digital control circuit 226 is implemented as a microcontroller or other type of processor capable of executing machine instructions. Such a microcontroller can execute machine instructions to perform the method of FIG. 12. The steps executed by the microcontroller may be performed in the order shown in FIG. 12, or in a different order.

In other embodiments, the digital control circuit 226 is implemented as a combination of logic gates, flip-flops, comparators, and the like. Such a digital control circuit 226 implementation can be configured to perform the steps of FIG. 12 sequentially as shown or in a different order. Further, two or more of the steps of FIG. 12 can be performed in parallel (concurrently) by a digital control circuit that includes discrete comparators. For example, FIG. 12 includes multiple decision steps (e.g., steps 1214, 1218, 1222, etc.). In some embodiments, the digital control circuit 226 includes multiple digital comparators that compare the digital code output by the ADC to the various threshold values shown in the tables of FIGS. 8-10 to detect the fault conditions. Such comparators can operate in parallel instead of sequentially.

Figure 13:
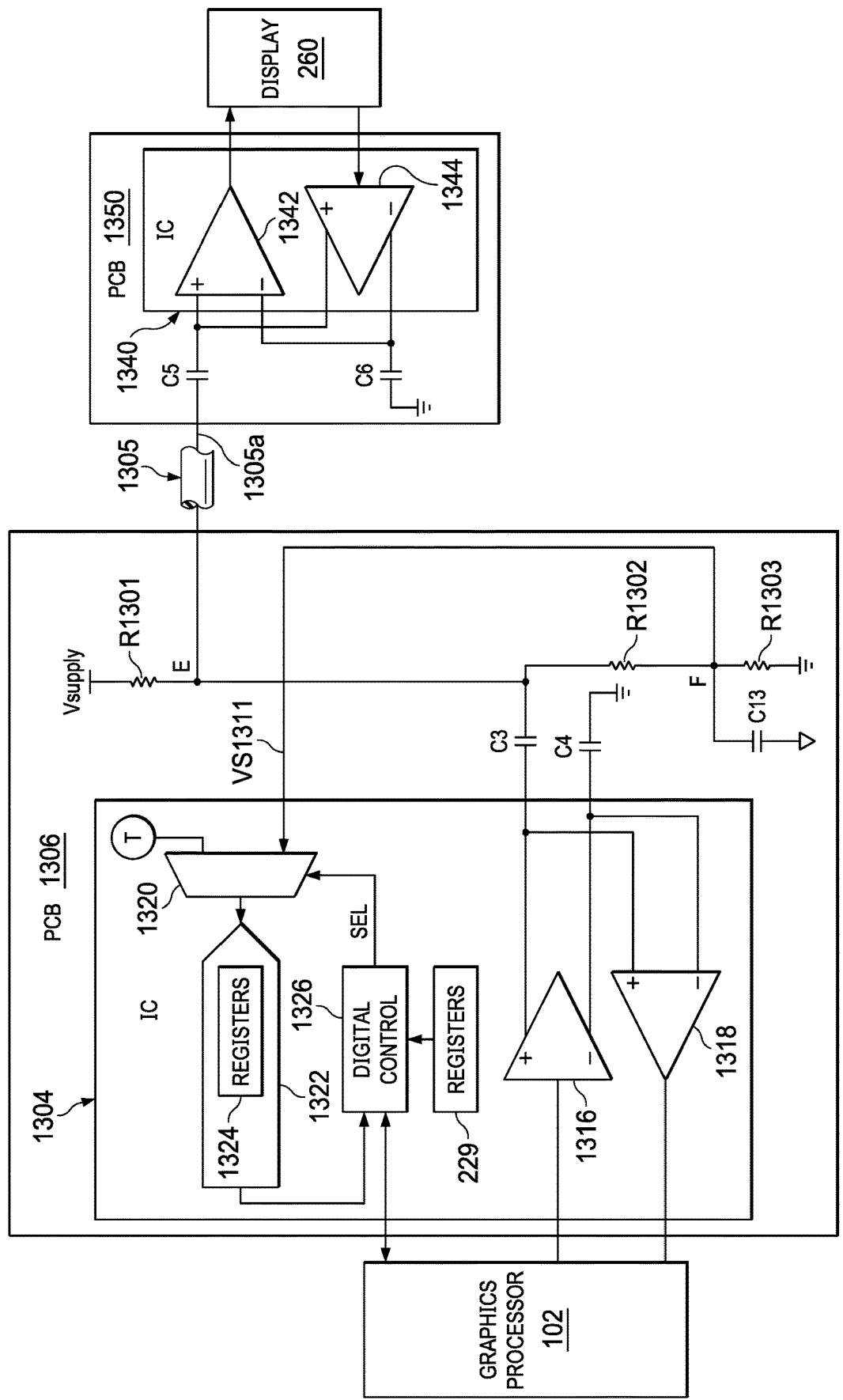
FIG. 13 is a schematic of an example system in which the cable is a coaxial ("coax") cable and a resistor divider is coupled to the conductor of the coax cable in accordance with an example.

The embodiment of FIG. 2 includes a cable that has two (or more) conductors coupled to the resistor divider network formed by resistors R1-R5. The conductors 105*a* and 105*b* may be a shielded twisted pair of wires providing differential signals between ICs 204 and 240. The features illustrated in FIG. 13 that have reference numbers with the same last two digits as a reference number for a feature in FIG. 2 (such as ADC 222 and ADC 1322) may be implemented in the same manner. FIG. 13 is an embodiment in which a cable 1305 interconnects IC 1304 on a PCB 1306 to IC 1340 on a PCB 1350. The cable 1305 in this example has a single signal conductor 1305*a* and is a coaxial (coax) cable. The shield around conductor 1305*a* may be grounded. A temperature sensor or other types of devices can be coupled to an input of a multiplexer 1320. The output of the multiplexer 1320 is coupled to an input of ADC 1322, which stores its digital codes in registers 1324. A digital control circuit 1326 asserts a select signal SEL to control the multiplexer 1320. The digital control circuit can also read the digital codes from the ADC's registers 1324. The multiplexer 1320, ADC 1322, and the digital control circuit 1326 are provided on the IC 1306. A transmitter 1316 and receiver 1318 are also provided on IC 1304, and are operative to send signals to, and receive signals from, corresponding receiver 1342 and transmitter 1344 provided on IC 1340.

The resistor divider in this example includes the serially-connected resistors R1301, R1302, and R1303. The connection point between resistor R1301 and resistor R1302 is node E, which is coupled to conductor 1305a. The connection point between resistor R1302 and resistor R1303 is node F, which provides the sense voltage VS1311 to an input of a multiplexer 1320.

The digital control circuit 1326 can use sense voltage VS1311 to detect normal operation (no cable faults), short-to-1.1V, and short to 1.8V. VS1311 for the normal operating condition is:

$$VS1311 = Vsupply \frac{R1303}{K3} \quad (29)$$

where K3=R1301+R1302+R1303. Assuming a +/−5% tolerance for Vsupply and a +/−1% resistor tolerance, the maximum and minimum sense voltage VS1311 (VS1311+ and VS1311−, respectively) can be derived as:

$$VS1311 \mathrel{+}= (Vsupply * 1.05)\left(\frac{R1303 * 1.01}{K3 * 0.99}\right) \quad (30)$$

$$VS1311 \mathrel{-}= (Vsupply * 0.95)\left(\frac{R1303 * 0.99}{K3 * 1.01}\right) \quad (31)$$

If node E (conductor 1305a) were shorted to VSupply, then:

$$VS1311 = Vsupply \frac{R1303}{R1302 + R1303} \quad (32)$$

Assuming a +/−5% tolerance for Vsupply and a +/−1% resistor tolerance, the maximum and minimum sense voltage VS1311 for the short-to-Vsupply fault condition are:

$$VS1311 \mathrel{+}= (Vsupply * 1.05)\left(\frac{R1303 * 1.01}{(R2 + R3) * 0.99}\right) \quad (33)$$

$$VS1311 \mathrel{-}= (Vsupply * 0.95)\left(\frac{R1303 * 0.99}{(R2 + R3) * 1.01}\right) \quad (34)$$

Figure 14:
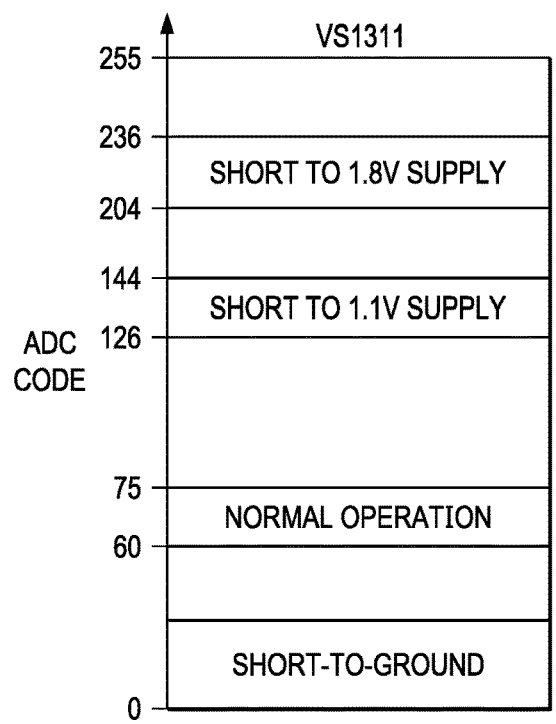
FIG. 14 is a graph of digital codes for a sense voltage of the resistor divider of FIG. 13 in accordance with an example.

For an 8-bit ADC converter 1322, FIG. 14 provides a table with an illustrative set of digital codes for each of the conditions: normal operation, short-to-1.1V, and short-to 1.8V. In this example, the normal operation digital codes span from 60 to 75. The short-to-1.1V codes span from 126 to 144. The short-to-1.8V codes span from 204 to 236. With only one sensing node (node F, sense voltage VS1311), the digital control circuit 1326 in this example will not be able to distinguish between an open cable fault and a short to ground fault.

Capacitor C13 is coupled in parallel across R1303. The combination of C13 and one or more of the resistances of R1301-R1303 forms a low-pass filter to filter out the higher frequency content of sense voltage VS1311 for purposes of analyzing the DC voltage level of sense voltage VS1311, as explained above.

Figure 15:
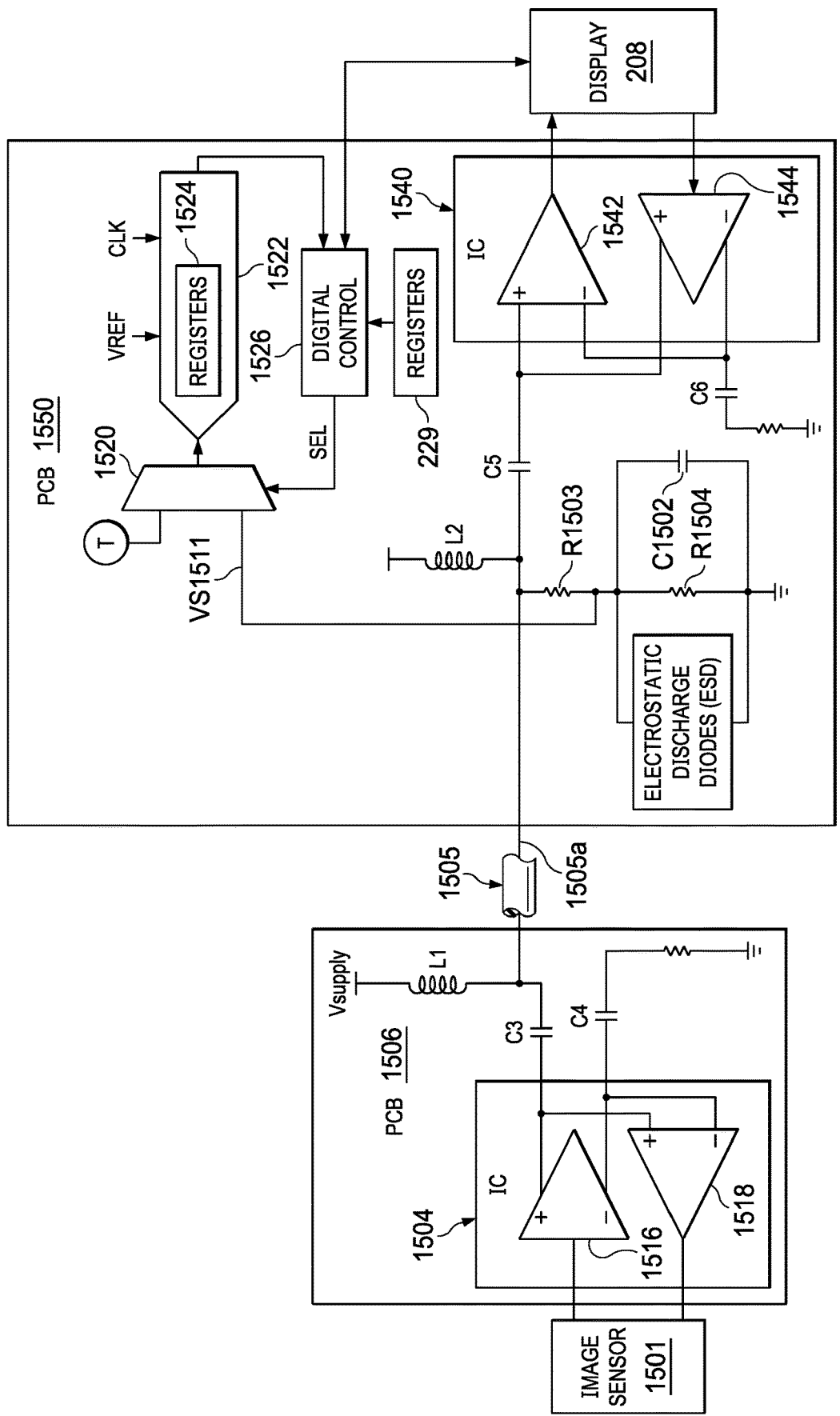
FIG. 15 is a schematic of an example system in which the cable is a power-over-coax (POC) cable and a resistor divider is coupled to the conductor of the coax cable in accordance with an example.

FIG. 15 is an example of a Power-Over-Coax (POC) implementation in which a cable 1505 interconnects IC 1504 on PCB 1506 to IC 1540 on PCB 1550. The features illustrated in FIG. 15 that have reference numbers with the same last two digits as a reference number for a feature in FIG. 2 and/or FIG. 13 (such as ADC 222, ADC 1322 and ADC 1522) may be implemented in the same manner. The cable 1505 in this example has a single conductor 1505a and is a coaxial (coax) cable. The shield around conductor 1305a may be grounded. An inductor L1 is coupled between Vsupply and conductor 1505a on PCB 1506. Similarly, an inductor L2 is coupled between the supply voltage and conductor 1505a on PCB 1550.

An image sensor 1501 (e.g., a camera) sends video signals through IC 1504, over cable 1505 to IC 1540 for display on display 208. The fault detection circuitry to detect a cable fault condition is located on PCB 1550 in this example (i.e., on the side of the cable 1505 where the display 208 is located). In another example, the fault detection circuitry is located on PCB 1506 (as in the preceding examples). The fault detection circuitry includes the multiplexer 1520, ADC 1522, digital control circuit 1526, and a resistor divider including resistors R1503 and R1504. The resistors are serially connected between the conductor 1505a and ground and provide a sense signal VS1511 to an input of the multiplexer 1520. A temperature sensor or other devices can be coupled to another input of multiplexer 1520. The output of the multiplexer 1520 is coupled to an input of ADC 1522, which stores its digital codes in registers 1524. A digital control circuit 1326 asserts a select signal SEL to control the multiplexer 1520. The digital control circuit can also read the digital codes from the ADC's registers 1524. A transmitter 1516 and receiver 1518 are provided on IC 1504, and are operative to send signals to, and receive signals from, corresponding receiver 1542 and transmitter 1544 provided on IC 1540.

In the POC example of FIG. 15, the digital control circuit 1526 can use sense voltage VS1511 to detect normal operation (no cable faults) or a short-to-battery fault. The battery may be the battery in an automobile in which the implementation of FIG. 15 is included. Sense voltage VS1511 for the normal operating condition is:

$$VS1311 = Vsupply \frac{R1502}{R15021 + R1502} \quad (35)$$

Assuming a +/−5% tolerance for Vsupply and a +/−1% resistor tolerance, the maximum and minimum sense voltage VS1511 voltages (VS1511+ and VS1511−, respectively) can be derived for the normal operating condition as:

$$VS1511 \mathrel{+}= (Vsupply)\left(\frac{R1502 +}{(R1501 -) + (R1502 -)}\right) \quad (36)$$

$$VS1511 \mathrel{-}= (Vsupply * 0.95)\left(\frac{R1502 * 0.995}{(R1501 * 1.01) + (R1502 * 1.005)}\right) \quad (37)$$

where R1502+ represents the resistance of resistor R1502 at the upper end of its +/−1% tolerance range, and R1501− and R1502− represents the resistances of resistor R1501 and resistor R1502, respectively, at the lower end of their +/−1% tolerance range.

Figure 16:
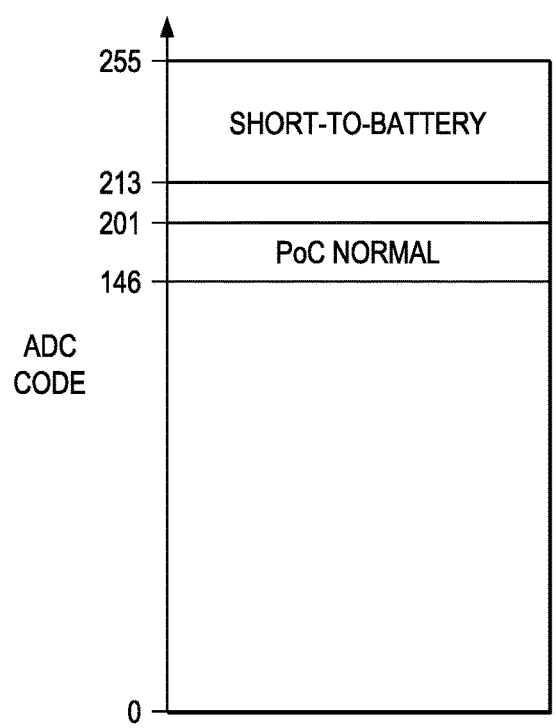
FIG. 16 is a graph of digital codes for a sense voltage of the resistor divider of FIG. 15 in accordance with an example.

For an 8-bit ADC converter 1522, FIG. 16 provides a table with an illustrative set of digital codes for each of the conditions: normal operation and short-to-battery. In this example, the normal operation digital codes span from 146 to 201. The short-to-battery codes span from 213 to 255. With only one sensing node (sense voltage VS1511), the digital control circuit 1526 in example of FIG. 15 will not be able to distinguish between an open cable fault and a short to ground fault.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and/or a PCB and other elements are external to the integrated circuit and/or PCB, in other example embodiments, additional or fewer features may be incorporated into the integrated circuit and/or PCB. In addition, some or all of the features illustrated as being external to the integrated circuit and/or PCB may be included in the integrated circuit and/or PCB and/or some features illustrated as being internal to the integrated circuit and/or PCB may be incorporated outside of the integrated circuit and/or PCB. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A method for detecting a fault within a cable connected to a resistor divider, the method comprising:
    converting, by an analog-to-digital converter (ADC), a first voltage from the resistor divider to a first digital code;
    determining, by a digital control circuit coupled to the ADC, whether the first digital code converted from the first voltage from the resistor divider falls within a first range of digital codes corresponding to a first fault associated with the cable;
    responsive to determining that the first digital code falls within the first range of digital codes, the digital control circuit generating an indication of the first fault; and
    responsive to the first digital code falling outside the first range of digital codes, the digital control circuit:
        controlling a multiplexer to apply a scaling factor to the first voltage to produce a scaled first voltage, which the ADC converts to a scaled first digital code; and
        determining whether the scaled first digital code falls within a second range of digital codes corresponding to a second fault associated with the cable.

2. The method of claim 1, further comprising, the digital control circuit:
    determining whether the first digital code falls within a third range of digital codes corresponding to a third fault associated with the cable; and
    responsive to determining that the first digital code falls within the third range of digital codes, generating an indication of the third fault.

3. The method of claim 2, in which:
    the first fault is a short to ground of a conductor within the cable; and
    the third fault is a short to each other of conductors within the cable.

4. The method of claim 1, further comprising:
    converting, by the ADC, a second voltage from the resistor divider to a second digital code; and
    responsive to determining that the scaled first digital code falls outside the second range of digital codes, the digital control circuit determining whether the second digital code falls within a third range of digital codes corresponding to a third fault associated with the cable.

5. An integrated circuit (IC) adapted to be coupled to a cable through a resistor divider including first and second resistors, the integrated circuit comprising:
- a multiplexer having a first multiplexer input, a selection input, and a multiplexer output;
- an analog-to-digital converter (ADC) having an ADC analog input and an ADC digital output, the ADC analog input coupled to the multiplexer output;
- a digital control circuit having a selection output coupled to the selection input of the multiplexer and having a digital input coupled to the ADC digital output, the digital control circuit configured to:
  - control the multiplexer to select the first multiplexer input, responsive to which the ADC is configured to convert a voltage of the first resistor to a first digital code;
  - determine whether the first digital code falls within a first range of digital codes corresponding to a first fault associated with the cable;
  - responsive to a determination that the first digital code falls within the first range of digital codes, generate an indication of the first fault; and
  - responsive to a determination that the first digital code does not fall within the first range of digital codes:
    - provide a control signal to the multiplexer, responsive to which the multiplexer is configured to apply a scaling factor to the voltage of the first resistor and the ADC is configured to produces a scaled first digital code of the voltage; and
    - determine whether the scaled first digital code falls within a second range of digital codes corresponding to a second fault associated with the cable.

6. The IC of claim 5, in which the digital control circuit is configured to:
- determine whether the first digital code falls within a third range of digital codes corresponding to a third fault associated with the cable; and
- responsive to a determination that the first digital code falls within the third range of digital codes, generate an indication of the third fault.

7. The IC of claim 6, in which:
- the first fault is a short to ground of a conductor within the cable; and
- the third fault is indicative of multiple conductors within the cable being shorted to each other.

8. The IC of claim 5, in which the multiplexer has a second multiplexer input adapted to be coupled to a second resistor within the resistor divider network, and in which the digital control circuit is configured to:
- assert the selection output to cause the multiplexer to select the second multiplexer input to thereby cause the ADC to convert a voltage of the second resistor to a second digital code; and
- responsive to a determination that the scaled first digital code does not fall within the second range of digital codes, determine whether the second digital code falls within a third range of digital codes corresponding to a third fault associated with the cable.

9. An integrated circuit (IC) adapted to be coupled to a cable through a resistor divider including first and second resistors, the integrated circuit comprising:
- a multiplexer having a first multiplexer input, a selection input, and a multiplexer output;
- an analog-to-digital converter (ADC) having an ADC analog input and an ADC digital output, the ADC analog input coupled to the multiplexer output;
- a digital control circuit having a selection output coupled to the selection input of the multiplexer and having a digital input coupled to the ADC digital output, the digital control circuit configured to:
  - control the multiplexer to select the first multiplexer input, responsive to which the ADC is configured to convert voltages of the first resistor to multiple first digital codes;
  - add an offset value to at least one of the first digital codes;
  - determine an average of the multiple first digital codes, with the added offset;
  - determine whether the average falls within a first range of digital codes corresponding to a first fault associated with the cable;
  - responsive to a determination that the first digital code falls within the first range of digital codes, generate an indication of the first fault.

10. A system, comprising:
- a resistor divider having multiple resistors coupled in series, at least one resistor of the multiple resistors adapted to be coupled to at least a first conductor of a cable;
- a multiplexer having a first multiplexer input, a selection input, and a multiplexer output, the first multiplexer input adapted to be coupled to a first resistor within a resistor divider network;
- an analog-to-digital converter (ADC) having an ADC analog input and an ADC digital output, the ADC analog input coupled to the multiplexer output; and
- a digital control circuit having a selection output and a digital input, the digital control circuit configured to:
  - assert the selection output responsive to which the multiplexer is configured to select the first multiplexer input, and the ADC is configured to convert a voltage of the first resistor to a first digital code;
  - determine whether the first digital code converted from the voltage of the first resistor falls between a second digital code and a third digital code; and
  - responsive to a determination that the first digital code falls between the second digital code and the third digital code, generate an indication of a first fault associated with the cable.

11. The system of claim 10, in which the resistor divider network includes at least five resistors in series, one of which is the first resistor.

12. The system of claim 11, in which the cable includes a second conductor and least a second resistor of the resistor divider network is coupled to the second conductor.

13. The system of claim 10, in which a capacitor is coupled to the resistor divider network to implement a low-pass filter.

14. The system of claim 10, in which the cable is a coaxial cable.

* * * * *